(12) United States Patent
Takaoka et al.

(10) Patent No.: US 6,544,692 B1
(45) Date of Patent: Apr. 8, 2003

(54) BLACK DEFECT CORRECTION METHOD AND BLACK DEFECT CORRECTION DEVICE FOR PHOTOMASK

(75) Inventors: Osamu Takaoka, Chiba (JP); Kazuo Aita, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/700,638

(22) PCT Filed: Apr. 19, 2000

(86) PCT No.: PCT/JP00/02556

§ 371 (c)(1),
(2), (4) Date: Feb. 26, 2001

(87) PCT Pub. No.: WO00/63946

PCT Pub. Date: Oct. 26, 2000

(30) Foreign Application Priority Data

Apr. 20, 1999 (JP) .......................................... 11-112623

(51) Int. Cl.⁷ .............................. G03F 9/00; G06K 9/00
(52) U.S. Cl. .......................... 430/5; 430/30; 430/296; 430/942; 382/144; 382/149; 250/492.2
(58) Field of Search .............................. 430/5, 30, 296, 430/942; 382/144, 149; 250/492.2

(56) References Cited

U.S. PATENT DOCUMENTS

| 5,767,974 | A | 6/1998 | Higashiguchi et al. ...... 356/394 |
| 5,799,104 | A | 8/1998 | Nakamura et al. .......... 382/144 |

*Primary Examiner*—Christopher G. Young
(74) *Attorney, Agent, or Firm*—Adams & Wilks

(57) ABSTRACT

In the present invention, a dot matrix taking a spot of an ion beam at a processing surface as one dot is set at the processing surface, the presence or absence of secondary charged particles, indicating the presence of a black defect, discharged from a plurality of dots including a noted dot and associated peripheral dots is detected while eliminating black defects by irradiating each dot of a processing region with an ion beam for a fixed time, calculating a physical quantity corresponding to this presence based on this detection information, and determining completion of processing of this noted dot when this value is less than or equal to a reference value.

5 Claims, 3 Drawing Sheets

FIG. 5B          FIG. 5C

BLACK DEFECT CORRECTION METHOD AND BLACK DEFECT CORRECTION DEVICE FOR PHOTOMASK

TECHNOLOGICAL FIELD

The present invention relates to a method for correcting black defects (Opaque defects) in a semiconductor photomask using a Focussing Ion Beam (FIB) and an apparatus thereof.

BACKGROUND ART

Conventionally, irradiating a prescribed region of a photomask with a focussed ion beam and eliminating black defects using sputtering effect or gas-supported ion beam etching has been provided as a method for eliminating remaining shading film material (black defects) for other than the prescribed pattern of a semiconductor photomask. First, a description is given based on FIG. 4 of an outline of a focussed ion beam processing apparatus of technology preceding the present invention. FIG. 1 shows an ion source 1, an ion beam 2, an electrostatic optical system 3, a deflecting system 4, a sample stage 5 for mounting a sample 10, a second charged particle feeding optical system 6 for collecting secondary charged particles 11, a mass spectrometer or secondary electron detector for detecting the presence and mass of the secondary charged particles 11, a signal processor 8, and a display 9. In the present invention, the sample 10 is a photomask having black defects 21, 22 and 23 where typically shading film material of chrome or chrome oxide exists on the photomask as shown in FIG. 1 during production. The present invention relates to technology for irradiating the defective portions with an ion beam and carrying out an eliminating process. Preferably, just the black defect region should be irradiated with a beam. There are problems, however, where if regions other than the black defect portions such as a foundation substrate of glass etc. (ex.Quartz etc.) are irradiated with a beam then these portions will be damaged or the transmission factor of glass portions may be lowered due to the injection of the ion beam. Defect correction is extremely important from the point of view of productivity because as the photomask is used to produce a large number of semiconductors, any defect in the photomask itself will be reproduced in any semiconductors made using such a mask. In Japanese Patent Publication No. Sho. 62-60699, a scanned image of the processing surface is obtained and a scanning region is specified based on this scanned image so that regions other than the black defects are not irradiated with the ion beam. Further, the black defect regions change with the process from one minute to the next. The image is therefore captured in stages so as to execute the process while confirming the black defect regions and therefore provide fine grain processing. However, setting scanning region based images for a number of stages cannot be said to be sufficient. Therefore, recently, in a process where processing is carried out by irradiating with a beam for a fixed time to give a fine grain, secondary charged particles indicating the presence of the workpiece every processing dot are monitored, it is determined that black defects are not already present when a value in excess of a reference value is not detected and the process is not carried out next time. However, this determination is based just on detection information for individual dots and new problems with processing defects occur such as over-etching and residual etching as a result of this determination being easily influenced by random noise.

It is therefore the object of the present invention to provide a photomask black defect correction method for monitoring secondary charged particles to determine the presence of black defects in portions irradiated with an ion beam where fine grain processing can be implemented for each dot so that highly reliable end point detection information which is not easily influenced by noise is obtained so that defective processing such as over-etching and residual etching does not occur.

DISCLOSURE OF THE INVENTION

In the present invention, a dot matrix taking a spot of an ion beam at a processing surface as one dot is set at the processing surface, the presence or absence of secondary charged particles, indicating the presence of a black defect, discharged from a plurality of dots including a noted dot and associated peripheral dots is detected while eliminating black defects by irradiating each dot of a processing region with an ion beam for a fixed time, calculating a physical quantity corresponding to this presence based on this detection information is carried out, and completion of processing of this noted dot is determined when this value is less than or equal to a reference value.

The present invention provides improved reliability in end point determination by taking a plurality of dots as a dot group in a matrix centered about a noted dot and then making determinations by making comparisons with a reference value while assigning different weightings to each dot according to the distance of each dot from the noted dot.

At defect regions coming into contact with non-processed regions such as a normal pattern region, etc., highly reliable end point determinations can also be achieved for special regions by carrying out determinations on noted dots to the exclusion of dots for detecting the presence of secondary charged particles indicating the presence of a workpiece.

PREFERRED EMBODIMENTS OF THE INVENTION

Figure 1:
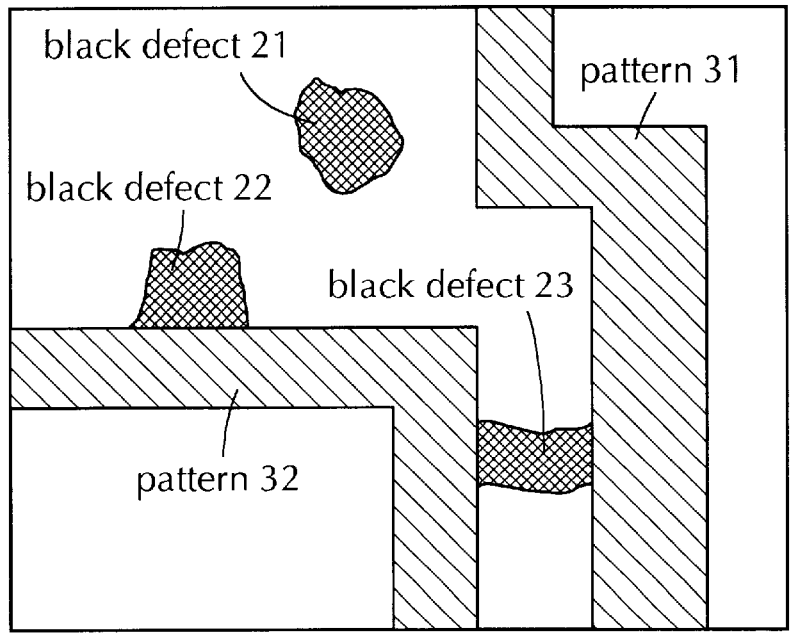
FIG. 1 is a photomask image taken with a scanning ion microscope.
Figure 2:
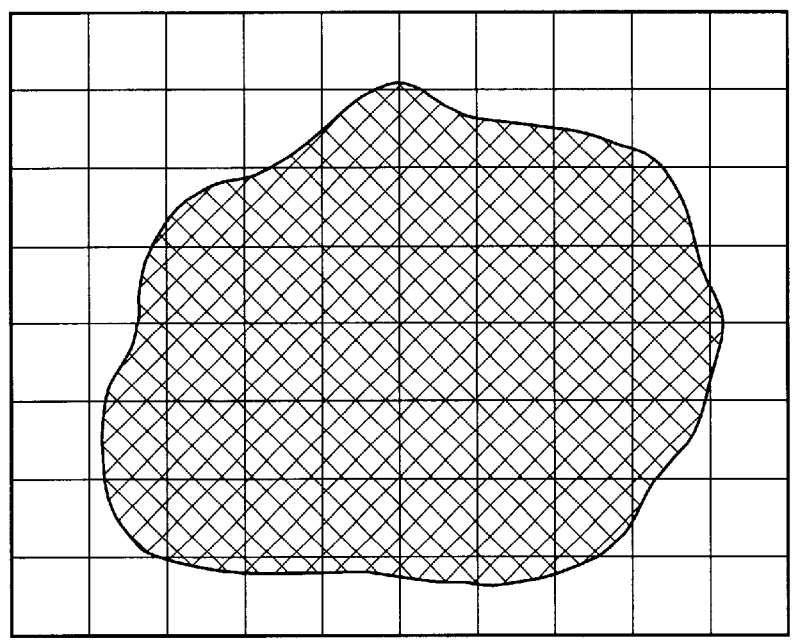
FIG. 2 is a dot matrix set for black defects on a photomask.
Figure 3:
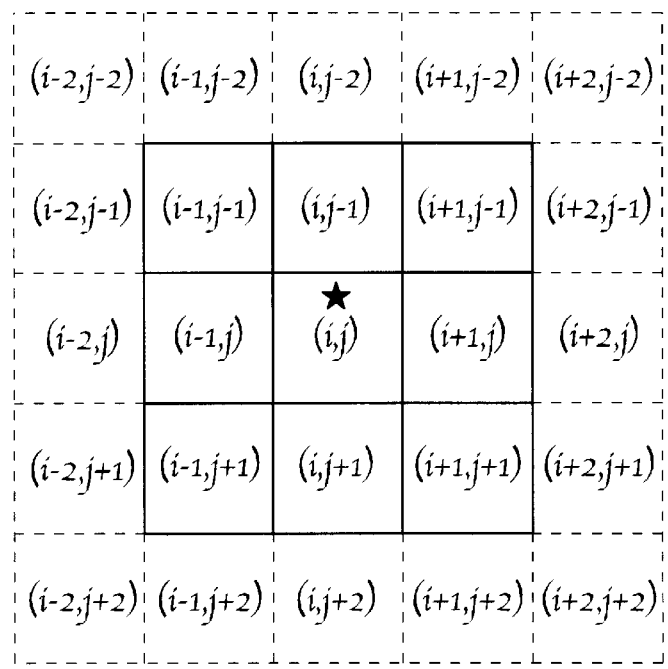
FIG. 3 is a conceptual view of setting of surrounding reference dots for noted dots.
Figure 4:
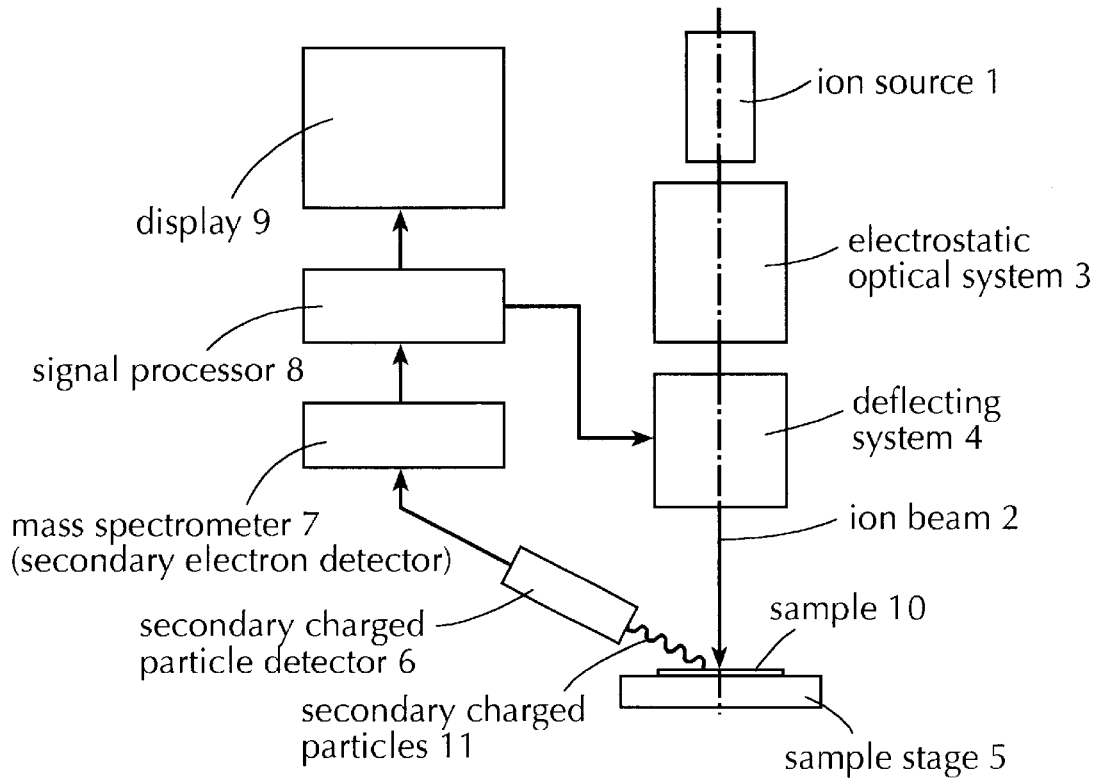
FIG. 4 is a view showing an example of a focussed ion beam processing apparatus employed in the present invention.
Figure 5A:
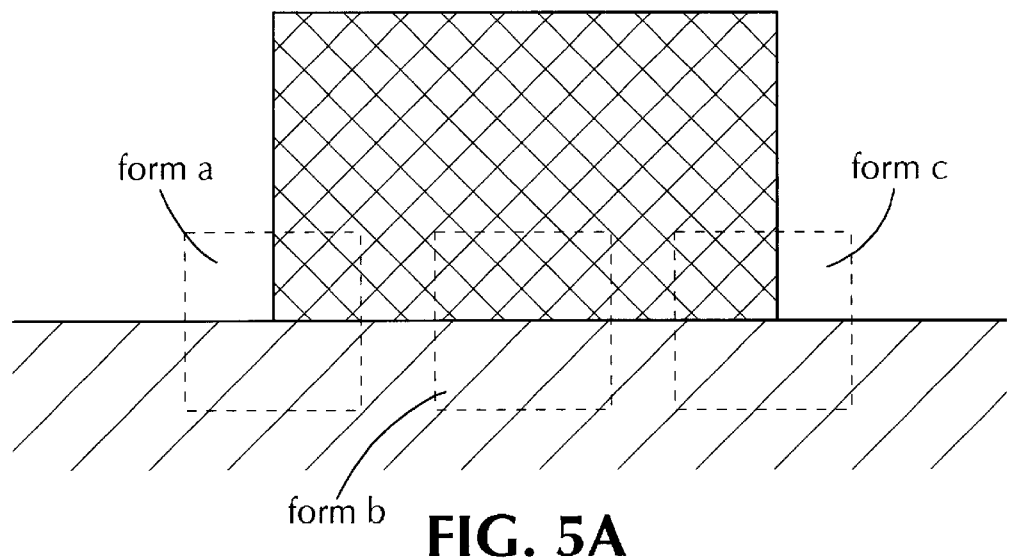
FIG. 5 is a conceptual view showing setting of surrounding reference dots for noted dots connected to non-processed regions.
Figure 5D:
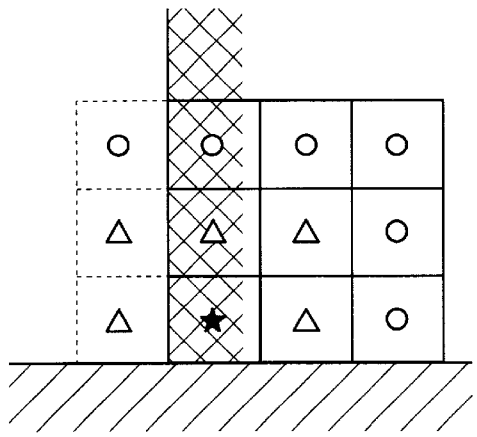
Figure 5D:
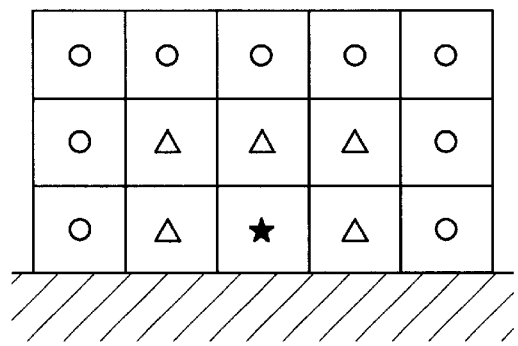
Figure 5D:
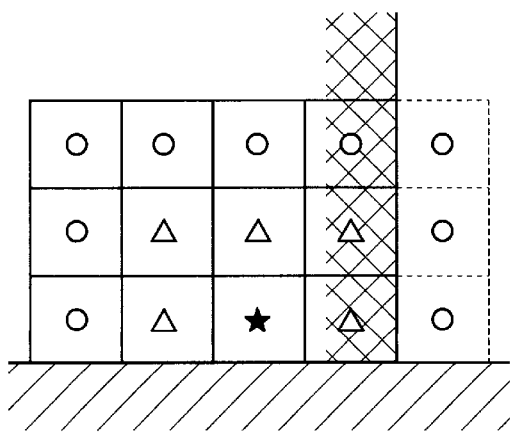

First, in this process, as shown in FIG. 1, a microscope image of the photomask surface shown in FIG. 1 is captured using ion beam scanning, displayed on a display 9, and black defect regions 21, 22 and 23 are specified using this image information. The purpose of the beam scanning is to capture an image rather than to carry out processing, and beam current is therefore kept low to ensure that the sample 10 is not damaged. The specified regions are then scanned by a high-current ion beam 2, and the black defect regions are eliminated by sputtering or gas-supported ion beam etching. However, as shown in FIG. 2, with this scanning, the ion beam spot is divided into regions of one dot using a matrix, with scanning being carried out in such a manner that the beam moves to the next dot after irradiating a portion for a fixed period of time. While irradiating the dot, secondary charged particles 11 discharged.from this portion are collected by the second charged particle feeding optical system 6. There are then passed to the mass spectrometer 7 where it is determined that black defects still exist when the secondary charged particles 11 show that residual shading film material such as, for example, chrome, still exists, or that there is no longer any residual shading film material, the defect has been eliminated, and the substrate exposed. This portion is then taken as an end point; and irradiation thereafter is halted. In other words, defective regions that change from one minute to the next with the elimination process are monitored based on real-time information regarding the presence or absence of black defects obtained according to the processing and correction proceeds by making determination as to the continuation or cessation of subsequent ion beam scans. If the information regarding the presence of black defects is reliable, fine grain correction to dot-level is possible, but random noise is included in the signal for the secondary charged particles 11 detecting the presence of the black defects and this influences reliability. Therefore, in the present invention, the determination region is set as shown in FIG. 3 so that the signal strength is not just for the secondary charged particles 11, is not just for the dot (i, j) of the mark ★ but is also enjoined by signal information for the surrounding dots so that the influence of random noise is alleviated and more reliable information can be obtained. To cite a specific example, a 3×3 dot matrix group taking the noted dot as center is set, and it is determined that irradiation is to be carried out the following time when 5 to 6 dots exist within those dots. Dot regions where this determination determines that there are no black defects present are sequentially excluded from the processing region in scanning thereafter. By repeating this operation, black defect regions are eliminated by processing in dot units to a fine grain by irradiation and over-etching and residual etching of the dot where elimination ends is avoided.

In the case of an isolated region such as 21 shown in FIG. 1 where the processing region does not make contact with the pattern 31, 32 of the photomask, the signal strength of the secondary charged particles occurring in the plurality of dots including the peripheral dots is comprehensively determined at the signal processor 8 and the presence or absence of a black defect at the noted dot is determined. The continuation or cessation of irradiation on the following occasion is then decided and the dot region which has no black defect and for which irradiation has stopped is stored in memory within the signal processor 8 as a region for which processing is completed thereafter and has no black defects. When the operation proceeds using this algorithm, a typically island-shaped isolated region gradually becomes smaller from the peripheral region towards the center, until a slightly elevated region remains, with this finally being completely eliminated. With defects having a plurality of slightly elevated regions, lake-shaped holes appear in the process of the defect becoming smaller from the peripheral region towards the center, with the island being divided into a plurality of islands which are each eliminated as the process proceeds. In either case, peripheral dot information is enjoined and a determination is carried out for the noted dot. The influence of random noise is therefore effectively eliminated, the reliability of the determinations is increased and there are very few processing defects such as over-etching or residual etching.

When black defect regions coming into contact with a normal mask pattern exist, the algorithm is changed slightly from the above case of an isolated region. This is not just because irradiation with an ion beam is not necessary for normal mask pattern regions, but because such irradiation may render the mask useless. Normal mask pattern regions are therefore stored and confirmed as non-processed regions during defect recognition so as to be excluded from ion beam irradiation regions. However, with black defect regions coming into direct contact with a normal pattern, the normal pattern region is processed in such a manner as to be excluded from the peripheral dots for obtaining detection information for the secondary charged particles. The number of samples of information for determining the presence or absence of defects is therefore reduced to the detriment of results for eliminating the noise component. Therefore, rather than setting a 3×3 dot matrix taking the noted dot (i, j) as center, a broader 5×5 dot matrix determination region is set for these regions. This does not, of course, mean that 25 dot samples are obtained, because normal pattern regions are excluded and the number of samples therefore falls accordingly. However, at this time, the degree of approximation of the information itself also falls because detection information for a region separated by a two dot distance from the noted dot ★ is used, i.e. there is a problem caused not by noise, but by the reliability of the signal itself falling. To this end, the present invention therefore obtains a highly reliable comprehensive determination as a result of obtaining a balance by assigning a weighting of noted dot>inner dot>outer dot in response to distance from the noted dot.

First Embodiment

In this embodiment, with regards to the dot matrix shown in FIG. 3, a 3×3 dot matrix centered about the noted dot (i, j), i.e. a nine dot matrix from (i−1, j−1) to (i+1, j+1) of secondary charged particle information is taken as basic information for determining the presence or absence of black defects at the noted dot. First, in the elimination process, a scan is made with the ion beam 2 with the current turned down, a microscope image such as shown in FIG. 1 is obtained, the locations of the black defects are understood, and a processing region corresponding to the defective regions is specified. This specification is carried out by dividing the region up into units of dots corresponding to the size of the spot of the ion beam using the two-dimensional matrix shown in FIG. 2 so as to specify the processing region. Scanning is then carried out so as to irradiate all of the dots decided upon as the processing region sequentially for fixed periods of time with the ion beam 2. This irradiation is for eliminating black defects using sputtering or gas-supported ion beam etching and is therefore executed with a substantially larger current compared with the ion beam for image capture. During this irradiation, secondary charged particles 11 discharged from this region are collected by the second charged particle feeding optical system 6 and charged particles indicating that black defects remain are detected by the mass spectrometer 7. At the signal processor 8, this detection amount is binarized into presence data by comparing, for example, an amount of detected chromium ions and a set threshold value for storage in internal memory in a manner corresponding to dot position information. When the scanning has gone one full loop, when binary data is displayed on the display, a black defect image for after the scan is displayed at the display 9. The next operating region is then specified based on this image information. However, image information for the surrounding eight dots shown by the solid line in FIG. 3 is also captured together with each dot, but when the number of dots indicating presence is typically a majority in excess of 5 to 6, this noted dot (i,j) is determined for continuation of irradiation at the signal processor 8 and specified as a processing region. Beam scanning means (the deflection system 4) is then controlled during the following scan in such a manner that a sputtering process or gas-supported beam etching process is only at dot positions specified as the region to be processed. Here, 5 to 6 is given just as an example reference value and does not have to be decided univocally as an optimum value but may also be reviewed depending upon the manufacturing conditions for the photomask, or may be decided upon in an appropriate manner for each type of mask. When the value for the noted dot is less than the reference value so that it is determined that no black defect is present, this region is stored in memory as a region for which processing is complete. This dot is consequently not irradiated with an ion beam thereafter. This specifying of the processing region and repeating of ion beam irradiation scanning is then repeatedly executed until the black defects are eliminated from the mask surface.

In this embodiment, image capture is executed in parallel with the sputtering process or gas-supported ion beam etching process but a scan of one loop for processing may also be separately executed as a beam scan for image capture. This beam scan is carried out with the beam current turned down in order to limit damage to the mask. In this case, beam scanning is executed for a beam scanning region which is a region one dot to the outside of the region requiring processing on the previous occasion. In this case, broadening one dot to the outside is implemented because ion beam current is low and there is therefore no fear of damaging the substrate portion as a result of exposure to the ion beam and this broadening of the scan to one dot to the outside ensures that more reliable sample information is obtained.

Second Embodiment

Next, a preferred embodiment is shown for black defects such as the black defects 22 and 23 of FIG. 1 which make contact with normal patterns 31 and 32 of the photomask. The difference with the isolated defect region is that the same type of ions are detected from the normal pattern as for the black defect region but this region is a region which is not processed. Implementation of the present invention so as to exclude this region and eliminate the influence of noise comes up against the problem that the required peripheral information for the region coming into contact with the pattern cannot be acquired. In order to obtain more reliable information, rather than the peripheral information just being the neighboring dots, the peripheral information is expanded to take in a 5×5 matrix of information for further neighboring dots. Each of the dots for the region that comes into contact with the mask pattern corresponds to a form "a" for a corner dot as shown in FIG. 5, a form b for a side dot, or a form c for one inner part of a corner, with, for example, for a form a as shown in B of FIG. 5, a weighting of the noted dot ★ and an inner neighboring dot △ being 0.8, a weighting with an outer dot ○ being 0.2, and a reference value being 2.1. At the form b, the weighting of a noted dot ★ and an inner neighboring dot △ is 0.8, the weighting with an outer dot ○ is 0.2, and a reference value is 3.3. At the form c, the weighting of a noted dot ★ and an inner neighboring dot △ is 0.8, the weighting with an outer dot ○ is 0.2, and a reference value is 5.2. At this time, determinations for dots at a boundary connected to dots where the glass of the substrate is exposed are calculated by taking in information (the broken line region) for one dot to the outside, but this is handled in the same manner as for peripheral dots of the isolated region.

In this embodiment, a plurality of types (in this embodiment, four types) are prepared as a reference for determining whether to continue or halt processing in a following beam scan and determinations are then made by appropriately selecting the type for each dot of the region being processed. Namely, the determination reference specifies the peripheral dots taken in as information to be used in the determination and means the weighting to be applied to detected information and the reference value to be compared. A 3×3 matrix reference is applied to dots that do not make direct contact with the mask pattern as with the isolated region defects and one of three types of reference for corner dots (form a), dots inside of the corner dots (form b) and dots further inside still (form c) are selected in an appropriate manner as a reference for dots making direct contact with the mask pattern.

The manner in which these defect regions that come into contact with a normal mask pattern which is not to be processed has several decided tendencies depending on the conditions of manufacturing the photomask. With respect to this, the aforementioned determination method is not optimized for the settings for this embodiment, and it would therefore be preferable for optimization to be attained through appropriate adjustment of the determination reference and the manner of irradiating the ion beam according to the photomask type in an actual practical situation. Optimum settings obtained through experience can then be stored in the signal processor 8 and applied to the same types of photomask thereafter.

Field of Industrial Utilization

With the photomask defect elimination method of the present invention, a dot matrix taking the spot of an ion beam at a processing surface as one dot is set at a processing surface, the presence or absence of black defects is detected for each dot, and a fine grain elimination process is implemented for each dot. The presence or absence of secondary charged particles indicating the presence of the workpiece is then detected from a plurality of dots including the noted dot and its surrounding dots, and a comprehensive determination of the presence or absence of a black defect is made. This makes it possible to implement an extremely reliable elimination process which is not influenced by noise. The elimination process advances while acquiring images corresponding to the presence or absence of black defects that gradually change with the process of sequentially scanning every dot of the processing region with fixed time irradiation. There is therefore no possibility of over-etching or residual etching occurring for dots where shading film material no longer exists.

Further, information reliability can be improved by increasing the sample number by giving weightings corresponding to distances for the detection information of the noted dot and its surrounding dots and the reliability of determinations of the presence or absence of black defects at special regions can therefore be improved.

What is claimed is:

1. A photomask black defect correction method, wherein a dot matrix taking a spot of an ion beam at a processing surface as one dot is set at the processing surface, the presence or absence of secondary charged particles, indicating the presence of a workpiece, discharged from a plurality of dots including a noted dot and associated peripheral dots is detected while eliminating residual matter by irradiating each dot of a processing region with an ion beam for a fixed time, calculating a physical quantity corresponding to this presence based on this detection information, and determining completion of processing of this noted dot when this value is less than or equal to a reference value.

2. The photomask black defect correcting method of claim 1, wherein the plurality of dots is a 3×3 matrix centered about the noted dot, with processing of the noted dot ending when a number of dots for detecting the presence of the workpiece is equal to or less than the reference value.

3. The photomask black defect detection method of claim 1, wherein the plurality of dots is a 5×5 matrix centered about the noted dot, and a comparison determination with the reference value is carried out on the noted dot, an inner eight dots, and an outer sixteen dots of information for detecting the presence of the workpiece by assigning different weightings of noted dot>inner eight dots>outer sixteen dots.

4. The photomask black defect correcting method of claim 1, wherein determinations as to whether or not to continue or end processing of the noted dot is carried out by excluding a plurality of dots for detecting the presence or absence of secondary charged particles indicating the presence of the workpiece for non-processed regions, at defect regions making contact with non-processed regions of the mask pattern, etc.

5. A black defect correction apparatus, comprising: scanning means for scanning dot matrix regions taking a spot of a focussed ion beam as one dot with an irradiating ion beam; means for capturing secondary charged particles and selectively detecting specific charged particles; means for binarizing a specific charged particle detection amount; means for storing the binarized data in a manner corresponding to an ion beam irradiating dot location; and means for totaling the binarized data corresponding to the noted dot and surrounding dots, comparing this total with a reference value, and determining whether or not to continue with processing of the noted dot.

* * * * *